US006658630B1

(12) United States Patent
Threatt et al.

(10) Patent No.: US 6,658,630 B1
(45) Date of Patent: Dec. 2, 2003

(54) METHOD TO TRANSLATE UDPS USING GATE PRIMITIVES

(75) Inventors: Vance Threatt, Ft. Collins, CO (US); Viswanathan Lakshmanan, Westminster, CO (US)

(73) Assignee: LSI Logic Corporation, Milpitas, CA (US)

( * ) Notice: Subject to any disclaimer, the term of this patent is extended or adjusted under 35 U.S.C. 154(b) by 203 days.

(21) Appl. No.: 09/710,359

(22) Filed: Nov. 9, 2000

(51) Int. Cl.[7] .............................................. G06F 17/50
(52) U.S. Cl. ................... 716/3; 716/18; 716/4; 716/5
(58) Field of Search ...................... 716/1–18

(56) References Cited

U.S. PATENT DOCUMENTS

| | | | | |
|---|---|---|---|---|
| 5,987,239 A | * | 11/1999 | Kirsch | 395/500.02 |
| 6,132,109 A | * | 10/2000 | Gregory et al. | 395/704 |
| 6,135,647 A | * | 10/2000 | Balakrishnan et al. | 395/500.19 |
| 6,226,780 B1 | * | 5/2001 | Bahra et al. | 716/18 |
| 6,247,165 B1 | * | 6/2001 | Wohl et al. | 716/5 |

OTHER PUBLICATIONS

Li et a, "HML, A Novel Hardware Description Language and its Translation to VHDL," IEEE, Feb. 2000, pp. 1–8.I.*
Renaudin et al, "A Design Framwork for Asynchronous/Synchronous Circuits Based on CHP to HDL Translation," IEEE, 1999, pp. 135–144.*
Gary Spivey, "EP3: An Extensible Perl Preprocessor," IEEE, Mar. 1998, pp. 1–8.*
Lung et al, "Verilog Netlist as an Exchange Language," IEEE, 1994, pp. 10–14.*

* cited by examiner

*Primary Examiner*—Vuthe Siek
(74) *Attorney, Agent, or Firm*—Trexler, Bushnell, Giangiorgi & Blackstone, LTD

(57) ABSTRACT

A software program to translate a Verilog UDP (User Defined Primitive) into basic logic gates, in order to allow easier porting into other HDL languages and non-Verilog models, such as the LogicVision model. In a preferred embodiment the program is in Perl script, and reads in a Verilog source file. On finding a UDP, the script writes out a gate level description of the UDP into a Perl hash data structure, which is later used to output a LogicVision model.

36 Claims, 1 Drawing Sheet

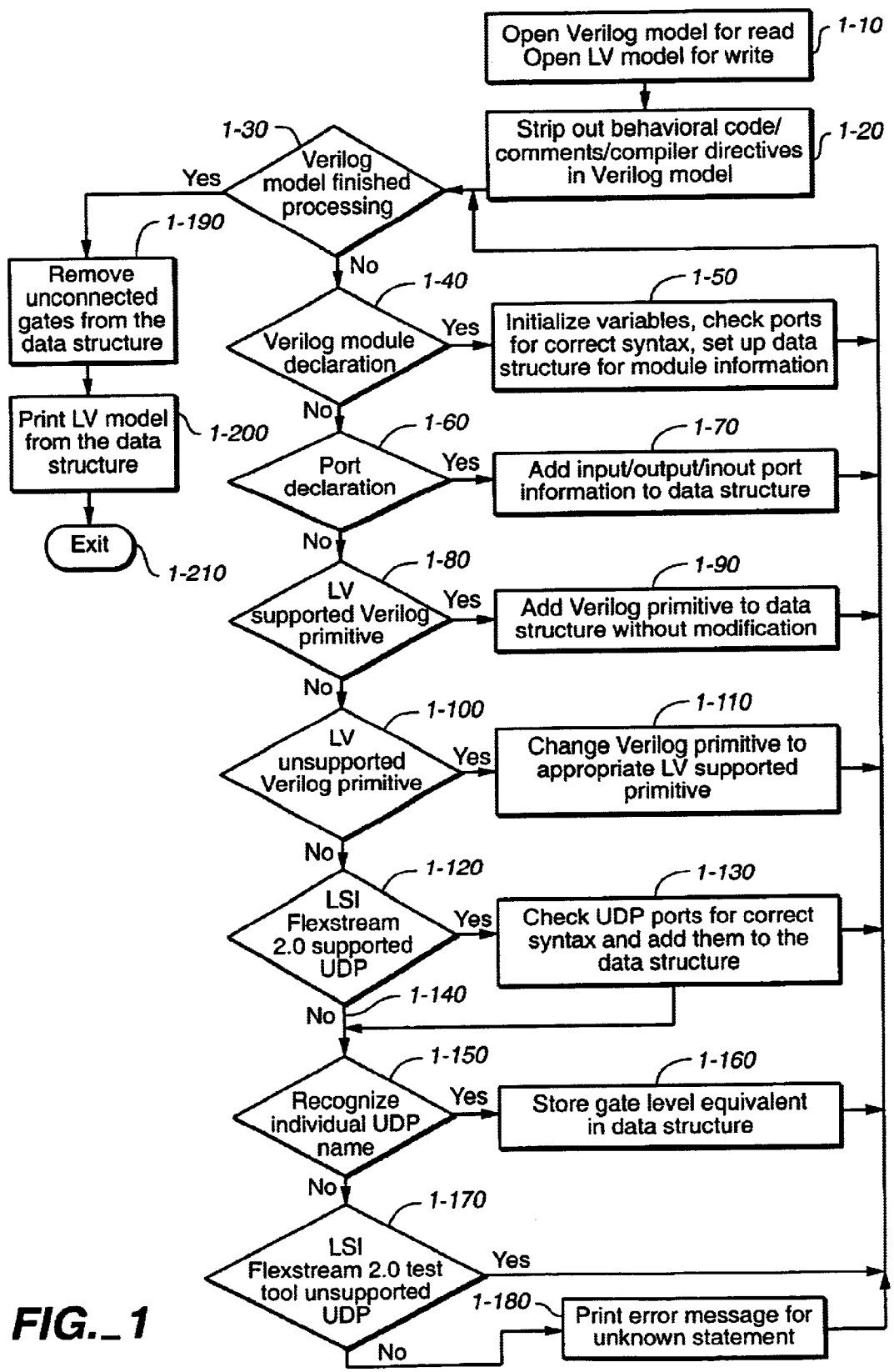
FIG._1

METHOD TO TRANSLATE UDPS USING GATE PRIMITIVES

REFERENCE TO MICROFICHE APPENDIX

Attached hereto is a microfiche appendix to the present invention, listing source code for an embodiment of the present invention. The total number of microfiche is 18 pages and the total number of frames is 19 frames.

BACKGROUND OF THE INVENTION

1. Field of Invention

The present invention relates generally to a method of translating User Defined Primitives (UDPs) in the Verilog format into another format.

2. Description of Related Art

Modern digital design of complex circuits and systems, which can contain millions of interconnected gates, involves a number of techniques for manageable design. Tools using computer-aided design (CAD), hardware description languages (HDL), logic synthesis, and hierarchy design are employed.

A hardware description language (HDL) representation of a circuit is a representation of a circuit in text rather than graphically, enabling a more uniform, portable representation of the circuit, one that can be manipulated by a computer program. Currently, Verilog and VHDL are two IEEE standards of HDLs. The Verilog standard evolves over time, and the present invention is designed to work with the current version, though it is adaptable to work with future versions of the Verilog IEEE standard. HDL may be stylized into "structural" (e.g. at the gate-level), "behavioral" or "dataflow" (typically at the higher level description of a circuit), or any combination of the above. HDL representations are used in logic synthesis, the conversion of a high-level electronic circuit description into a list of logic gates and their interconnections, called the "netlist".

An HDL description of a system can be written at an intermediate level referred to as a register transfer language (RTL). A subset of RTL that is used by logic synthesis tools is known as "snythesizable RTL". A logic synthesis tool with a library of components can convert a RTL description into an interconnection of primitive components that implements the circuit, subject to any specified constraints, such as timing, speed, power consumption and area constraints. The output of the logic synthesis tool, after an optimization process referred to as technology mapping, is a so-called netlist of interconnected storage elements, gates, and other functional blocks (note the term "net" is also a keyword in Verilog, and represents a data type comprising a physical connection between structural elements). The netlist output serves as input to physical design tools that physically place the logic elements and route the interconnections between them to produce a manufacturing circuit layout. When programmable parts are employed, such as field-programmable gate arrays, binary information is produced by design tools to program the logic within the parts.

User-defined primitives (UDP) in the Verilog HDL language are user-defined primitive gates that lie outside the "built-in" primitive gates provided by Verilog, such as "and", "nand", "nor", "or", "xor", "xnor", "buf", "not", "cmos", "pmos", "nmos", "tran" and the like. Oftentimes, a designer may wish to translate a Verilog UDP into another format, such as a LogicVision model format.

LogicVision (LV) is a company that produces a suite of test insertion tools that take a netlist, insert structures, and convert the netlist and into a form suitable for testing purposes. The LogicVision suite performs such functions as boundary scan insertion, automatic test pattern generation, logic and memory BIST (Built-In Self Test) insertion. LogicVision uses a particular format, which can be viewed as a subset of the Verilog HDL. The entire Verilog HDL is not understood by LogicVision, and a Verilog model has to be translated into a LogicVision model before it can be used by a LogicVision test insertion tool. The LogicVision model format is easy to describe once the Verilog HDL is translated into basic logic gate descriptions. Thus, concerning the present invention, by translating a circuit described in a Verilog format, having UDPs (User Defined Primitives), into its constituent logic gates, a LogicVision format is easily obtainable, thus making the original circuit description suitable to a test insertion tool such as found in the LogicVision suite.

SUMMARY OF THE INVENTION

The present invention relates generally to a method of translating Verilog User Defined Primitives (UDP) to basic logic gates, i.e., gate level primitives, which can be used in another format, such as the LogicVision model format.

Accordingly, an aspect of the present invention is to provide a software program to translate a Verilog UDP (User Defined Primitive) into basic logic gates, in order to allow easier porting into other HDL languages and non-Verilog models, such as the LogicVision model. LogicVision libraries and many other libraries rely primarily on Verilog models, such as the Verilog XL 3.0 library, thus the present invention has value in providing UDP translation for such non-Verilog models.

In a preferred embodiment, the program is in Perl script, and reads in a Verilog source file. On finding a UDP, the script writes out a gate level description of the UDP.

The advantages of the present invention are:

(1) providing a unique method to translate UDPs into gate primitives;

(2) converting into a lowest common denominator between standards, by way of a gate description of a Verilog UDP, enabling porting of a Verilog UDP into another model, such as a LogicVision model;

(3) allowing better handling of 'x' states and event scheduling by using gate level primitives;

(4) providing an interface for other software tools that have difficulty reading in Verilog UDPs.

The above described features and many other features and attendant advantages of the present invention will become apparent from a consideration of the following detailed description when considered in conjunction with the accompanying drawings.

BRIEF DESCRIPTION OF THE DRAWINGS

Detailed description of preferred embodiments of the invention will be made with reference to the accompanying drawings.

FIG. 1 is a top-level flowchart depicting a preferred embodiment of the invention.

DETAILED DESCRIPTION OF THE PREFERRED EMBODIMENTS

Disclosed herein is a detailed description of the best presently known mode of carrying out the invention. This description is not to be taken in a limiting sense, but is made merely for illustrating the general principles of the invention. The section titles and overall organization of the present detailed description are not intended to limit the present invention.

User-defined primitives (UDP) in the Verilog HDL language are user-defined primitive gates that lie outside the "built-in" primitive gates provided by Verilog, such as "and", "nand", "nor", "or", "xor", "xnor", "buf", "not", "cmos", "pmos", "nmos", "tran" and the like. UDP allow a user more flexibility in defining a primitive circuit. A UDP can be described as either combinational or sequential (edge-triggered and level-sensitive). A UDP is instantiated the same way as a built-in Verilog primitive gate, and declared using the following syntax (keywords are in bold):

```
primitive UDP_name (OutputName, List_of_inputs);
   Output_declaration
   List_of_input_declarations
   [Reg_declaration]
   [Initial_statement]
   table
      List_of_table_entries
   endtable
endprimitive
```

A UDP definition does not depend on a module definition and thus appears outside of a module definition, and can be in a separate text file. Further, a UDP can have only one output and may have one or more inputs. The first port must be the output port, which can have the value 0, 1 or x. The behavior of a UDP is described in the form of a table.

Two kinds of behavior can be described in a UDP: (1) combinational and (2) sequential (edge-triggered and level-sensitive).

An example of a combinational UDP circuit is a 2-to-1 multiplexer, e.g.:

```
primitive MUX2x1 (Z, Hab, Bay, Sel);
   output Z;
   input Hab, Bay, Sel;
   table
   //Hab    Bay    Sel    : Z
   0        ?      1      :0;
   1        ?      1      :1;
   ?        0      0      :0;
   ?        1      0      :1;
   0        0      x      :0;
   1        1      x      :1;
   endtable
endprimitive
``` with the ? character representing a don't-care condition (any of 0, 1 or x), and the order of the input ports matching the order of entries in the table.

An example of a sequential circuit UDP might be the following level-sensitive sequential UDP that models a D-type latch. With the clock at 0, the data passes from input to output, otherwise the value remains latched. The — character implies no change, and the state of the UDP is stored in register Q.

```
primitive Latch (Q, Clk, D);
   output Q;
   reg Q;
   input Clk, D;
   table
   //    Clk    D    Q(state)    Q(next)
         0      1    :?          :1;
         0      0    :?          :0;
         1      ?    :?          :-;
   endtable
endprimitive
```

The goal of the present invention is to decompose and translate these UDPs into their constituent gate-level primitives (e.g., nand, nor, xor gates), all the while preserving the functionality of the UDPs.

Turning now to FIG. 1, there is shown a top-level flowchart for carrying out a generalized software driven tool employing the principles of the present invention. The software tool may be written in any computer language, preferably Perl, and run by a general purpose computer system, preferably a computer with ample primary and secondary memory storage, or any specialized hardware or firmware. Depending on the language used to construct and implement the translation tool software, the software may have any number of classes, functions, subroutines, objects, variables, templates, module(s), lines of code, portions of code and constructs (collectively and generally, and as depicted by the flowcharts herein, "a process step", "step", "block", "block step" or "software module", with the understanding "module" is also a keyword in Verilog) to carry out the invention in successive stages as described and taught herein, and may be either a standalone software application, or employed inside of or called by another software application. The software process or software module may be constructed so that one portion of code in the application performs a plurality of functions, as for instance in Object Oriented programming (e.g., an overloaded process). The converse is also true in that a plurality of software modules or process steps may be constructed to perform the function of a single process step described herein, without loss of generality for the present invention. At any stage of the process step of the present invention, intermediate values, variables and data may be stored for later use by the program. The software of the present invention is preferably designed to work with the present Verilog IEEE standard, and in particular with Verilog XL 3.0. Verilog XL 3.0 is a Cadence simulator of the Verilog HDL. However, in general, using the principles disclosed herein, it is possible to adapt the software to work with future standards of the Verilog HDL, and future simulators of Verilog, as they may evolve.

Referring now to the top-level flowchart of the invention in FIG. 1, and to the source code in the Perl programming language attached hereto as a microfiche appendix, a preferred embodiment of the invention will be described.

Generally, the invention can be broadly broken down into three portions. Software module(s) open for reading an input file containing source code describing a Verilog model circuit, and open for writing an output file that will contain the LogicVision model code. Second, software module(s) go through the Verilog model, which is described in one long string, and remove portions of the string that relate to various features in Verilog. The features are stored in a data structure that uses a hash function to store the features. Software module(s) translate and decompose the Verilog portions of the string into constituent parts that comprise primitives and portions of a netlist that may be used to translate the Verilog model into the LogicVision model. Finally, suitable software module(s) clean up the data structure and output the LogicVision model in a suitable format that a user may utilize. In the present invention, one or more software modules may be combined to perform the same task, and a software module may be broken up into several other software modules to collectively perform a given task, without detracting from the generality of the invention and the description herein.

Turning attention now to FIG. 1, there is shown in a first process step, the Verilog HDL model (the source code describing a circuit in Verilog HDL) is opened to be read by the software program, as disclosed by step 1-10 in FIG. 1. This step corresponds in the Perl source code of the microfiche appendix as program lines 112 on pg. 2, in the line marked "open (INFILE,"<$verfile") . . . " In Perl, binary data can be treated as a string. In general, a string can include alphanumeric text and/or binary data, as the case arises.

Similarly, the LV model (LogicVision model) that is to be written to with the gate primitives is opened by the program of the present invention for a write operation, as indicated in step 1-10 in FIG. 1, and corresponding to the Perl source program lines 116, on pg. 2, in the line marked "open (OUTFILE, ">$lv_file") . . . ".

After reading the Verilog model source code (i.e., the Verilog HDL netlist description of the circuit), all behavioral codes, which have no bearing on a UDP, comments and compiler directives are stripped out of the string that has been read, as indicated in step 1-20 of FIG. 1, which corresponds in the Perl source code as program lines 120–126 on pg. 2, in the lines marked "if ($file=~/ initial|always . . . if ($file=~/specify.+endspecify . . . ".

In decision block step 1-30, the script ensures that it has completed processing the Verilog model that was read in. The Verilog model is contained in one long string, and the script removes portions of the string as it completes processing that section of the model. Once the string is empty, the script knows that the Verilog model has been completely processed. If the Verilog model has been processed, and the string is empty, the decision block 1-30 is satisfied (which can be thought of as satisfying a predetermined condition), and flow chart control is passed to block step 1-190 of FIG. 1; otherwise, if the string is not empty, control passes to decision block step 1-40. In the Perl source code this step corresponds to program lines 128, on pg. 2, in the line marked "while ($file) . . . ".

In decision block step 1-40, the Verilog module declaration is checked; the Verilog keyword "module" is searched for, along with the proper port list that must follow. A port list gives the list of ports (input, output or inout) through which a module communicates with external modules. If there is a valid Verilog module declaration, the decision block 1-40 is satisfied, and control is passed to step block 1-50, otherwise, control is passed to decision block 1-60 labeled "Port Declaration". The decision block step 1-60 corresponds in the Perl source code to program lines 132, on pg. 2, in the line marked "if ($file=~/^module . . . ".

In step block 1-50, the variables are initialized, ports are checked for correct syntax, and a Perl data structure is set up for cell information. The Perl data structure used is a hash of information as illustrated below (% indicates a Perl hash structure):

%module
   name=>verilog module name
   ports=>list of all verilog module ports
   inports=>list of verilog module input ports
   outports=>list of verilog module output ports
   inoutports=>list of verilog module inout (bidirectional) ports
   %primitives
      primname=>name of verilog gate primitive
      ports=>ordered list of verilog gate primitive ports
   %udps
      udpname=>name of verilog udp
      ports=>ordered list of verilog udp ports In the Perl source code this step corresponds to program lines 134–154, on pp. 2–3, in the lines marked %module=( ) . . . $module{ports}=&parse_and_check_ports ($2, $module{inports}. . . ". After this step, control is passed once again back to decision block 1-30, where the program continues in a loop until the Verilog model has been completely processed.

Assuming no Verilog module declaration, control is passed by the program of the present invention to decision block 1-60, where the Verilog HDL model is checked for port declarations. In the Perl source code this step corresponds to program line 160, on pg. 3, in the line marked if "($file=~/^(input|output|inout) . . . ".

If there is such a port declaration, decision block 1-60 is satisfied, and control is passed to step block 1-70, where the input/output/inout port information of the Verilog model is added to the data structure described in section block 1-50. In the Perl source code this step corresponds to program lines 164–166, on pg. 3, in the lines marked "if ($1 eq "input") . . . elsif ($1 eq "inout") . . . ". Control is then passed back to decision block 1-30, where the program continues to loop.

If there are no more port declarations in the Verilog model, control is passed to decision block 1-80 by the program of the present invention, where Verilog primitives that are supported natively by the LV model are checked to see if they are present. In the Perl source code this step corresponds to program line 198, on pg. 3, in the line marked "if ($file=~(/^($primlist) . . . ". If these LV supported Verilog primitives are present, control is passed to step block 1-90, where the Verilog primitive is added to the data structure without any need for modification. In the Perl source code this step corresponds to program line 208, on pg. 4, in the line marked "push @{$module{primitives}}. . . ". Control is then passed back to decision block 1-30.

If there are no LV supported Verilog primitives, control is passed to decision block 1-100. In the Perl source code this step corresponds to program lines 172, 185, on pg. 3, in the lines marked "if ($file=~/^nmos . . . and if ($file=~/^ (pmos|rpmos) . . . ". The Verilog model is checked for Verilog primitives unsupported by the LV model. If such LV unsupported Verilog primitives are found, decision block 1-100 is satisfied, and control is passed to step block 1-110, where the LV unsupported Verilog primitives are translated into and changed to LV supported primitives. In the Perl source code this step corresponds to program lines 179, 192, on pg. 3, in the lines which are both marked "push @{$module{primitives}}". Control is then passed back to decision block 1-30.

Assuming no unsupported Verilog primitives are found, control is passed by the program of the present invention to decision block 1-120, where the Verilog model is checked for the presence of LSI Flexstream 2.0 supported UDPs. LSI Flexstream 2.0 is a design kit that provides all tools and libraries necessary to complete an ASIC (Application Specific Integrated Circuit) design. LSI Flexstream 2.0 provides Verilog UDPs referenced by the Verilog library. In the Perl source code this step corresponds to program lines 214–225, on pg. 4, in the lines marked "if ($file=~/^(LSI_ MUX21\b|LSI_UDP_$_{MUX}$2\b . . . LSI_UDP_SB_AND_ RB_ACTIVE . . . ". If such LSI Flexstream 2.0 supported UDPs are found, decision block 1-120 is satisfied, and control is passed to step block 1-130, where the UDP ports are checked for correct syntax and added to the data structure. In the Perl source code this step corresponds to program line 229, on pg. 4, in the line marked "$ports= &parse_and_check_ports . . . ". Control is then passed back to the loop at point 1-140, where the next decision block 1-150 is encountered.

In decision block 1-150, LSI Flexstream 2.0 UDP names are recognized. In the Perl source code this step corresponds to program lines 235, 250, 258, . . . , on pg. 4 and onward, in the line marked "if ($file=~/^LSI_UDP_MUX21\b . . . ". If such individual UDP names are present, decision block 1-150 is satisfied, and control is passed to step block 1-160, where the gate level equivalent of such individual UDP names are stored in the Perl data structure. In the Perl source code this step corresponds to program line 239, 252, 260, . . . , on pg. 4 and onward, in the lines marked "push@{$module{udps}. . . ". Control is then passed back to decision block 1-30, where the program returns to the loop.

If no individual UDP names are recognized in decision block 1-150, control is passed by the program of the present invention to decision block 1-170, where the Verilog model is checked for LSI Flexstream 2.0 UDPs that are used for modeling reduced pessimism and aiding in timing checks. Modeling reduced pessimism and aiding timing checks are structures that are not required by LSI Flexstream 2.0 supported test tools such as LogicVision. In LSI Flexstream 2.0 test tools, a UDP is deemed unsupported on a case-by-case basis.

In the Perl source code the step of decision block 1-170 corresponds to program line 942, on pg. 15, in the line marked "if ($file=~/^($extraudps) . . . ". If such LSI Flexstream 2.0 test tool unsupported UDPs are found, then decision block 1-170 is satisfied, and control is passed back to decision block 1-30, where the program returns to the loop. If such UDPs are absent, then control of the program is passed to the portion of software shown by block 1-180, and an error message is outputted or printed for the presence of an unknown statement, as indicated by step block 1-180. This serves as a catch all for preventing any unexpected statements or definitions from being translated. In the Perl source code this step corresponds to program line 946, on pg. 15, in the line marked "if ($file=~/^(\w+.+?;) . . . ". This last step, 1-180, forms the last part of the loop comprising blocks 1-30 through 1-180, which may be though of as similar to a nested 'if-then', 'switch' and 'case' statement, with the last block, 1-180, forming the default case statement when all other conditions are not met.

Turning to step block 1-190, this statement is reached when, at decision block 1-30, the Verilog model has been completely processed. The Verilog model has additional gates used for aiding timing checks that are not needed by test tool models. These additional gates were previously connected to the UDPs that were removed in the previous step. After blocks 1-30 through 1-180 are completed, these gates will show up in the data structure as being unconnected from the rest of the module. At step block 1-190, the gates that are unconnected are removed from the data structure. In the Perl source code this step corresponds to program line 951, on pg. 15, in the line marked "&remove_extra_logic ($module{primitives}. . . ".

After step 1-190, control is passed by the software of the present invention to step block 1-200, where the LV model is outputted or printed, using typical I/O devices such as a monitor or printer, from the data structure. The output may also be in the form of electronic data such as HDL source code stored on a hard drive. In the Perl source code this step corresponds to program lines 957–989, on pg. 15, in the lines marked "print OUTFILE "celldefine . . . print OUTFILE"endcelldefine . . . ".

Finally, when the output from the program is complete, the software terminates, as indicated by the EXIT statement block 1-210.

Though the preferred embodiments are disclosed in the present invention, alternative mechanisms may be employed without departing from the scope of the invention. For example, the use of LSI Flexstream 2.0 supported UDPs could be replaced with another version of LSI Flexstream UDP, or any other UDP, without loss of generality. It is to be understood that while the invention has been described above in conjunction with preferred specific embodiments, the description and examples are intended to illustrate and not limit the scope of the invention, which is defined by the scope of the appended claims.

We claim:

1. A computer software system for translating HDL, comprising: a reading software module for reading a HDL description that describes a circuit; a translating software module which is configured such that said translating software module translates said HDL description from said reading software module into components comprising logic gates, obviating the need to translate said HDL description into OTDD graphs; and an output software module for outputting said components from said translating software module in a useable format, wherein said HDL description comprises Verilog User Defined Primitives (UDP); and, said output software module outputs said components in a file, said file in the LogicVision model format.

2. A computer software system for translating HDL, comprising: a reading software module for reading a HDL description that describes a circuit; a translating software module which is configured such that said translating software module translates said HDL description from said reading software module into components comprising logic gates, obviating the need to translate said HDL description into OTDD graphs; and an output software module for outputting said components from said translating software module in a useable format, wherein said HDL description comprises Verilog User Defined Primitives (UDP); and, said output software module outputs said components in a printed hardcopy, said printed hardcopy in the LogicVision model format.

3. A computer software system for translating HDL, comprising: a reading software module for reading a HDL description that describes a circuit; a translating software module which is configured such that said translating software module translates said HDL description from said reading software module into components comprising logic gates, obviating the need to translate said HDL description into OTDD graphs, wherein said HDL description is a Verilog HDL description and comprises Verilog User Defined Primitives (UDP); a decision block finished processing software module for processing the Verilog HDL description from said reading software module; said reading software module comprised of a software module reading in a string representing said Verilog HDL; said decision block finished processing software module comprised of a software module checking said string from said reading software module for the end of said string, indicating said Verilog HDL description has been completely processed; and a decision block Verilog module declaration software module for processing the Verilog HDL description from said reading software module; said reading software module comprised of a software module reading in a string representing said Verilog HDL; said decision block Verilog module declaration software module comprised of a software module searching said string for a portion of said string containing the Verilog keyword 'module', and for the corresponding port list to said 'module'.

4. The invention of claim 3, further comprising:
an initializing, check port and setup data structure software module for initializing variables relating to said portion of said string found in said decision block Verilog module declaration software module, for checking said corresponding port list for correct syntax, and for setting up a data structure for containing information relating to said components.

5. The invention of claim 4, wherein:
said data structure is a hash structure.

6. A computer software system for translating HDL, comprising: a reading software module for reading a HDL description that describes a circuit; a translating software module which is configured such that said translating software module translates said HDL description from said reading software module into components comprising logic gates, obviating the need to translate said HDL description into OTDD graphs; a decision block port declaration software module for processing the HDL description from said reading software module; said reading software module comprised of a software module reading in a string representing said HDL; said decision block port declaration software module comprised of a software module searching said string for port declarations, wherein said HDL description is a Verilog HDL description and comprises Verilog User Defined Primitives (UDP); a port information and setup data structure software module for setting up a data structure for containing information relating to said components, and for adding to said data structure input/output/inout port information relating to said Verilog model.

7. The invention of claim 6, wherein:
said data structure is a hash structure.

8. A computer software system for translating HDL, comprising: a reading software module for reading a HDL description that describes a circuit; a translating software module which is configured such that said translating software module translates said HDL description from said reading software module into components comprising logic gates, obviating the need to translate said HDL description into OTDD graphs, wherein said HDL description is a Verilog HDL description and comprises Verilog User Defined Primitives (UDP); a decision block LV supported Verilog primitives software module for processing the Verilog HDL description from said reading software module; said reading software module comprised of a software module reading in a string representing said Verilog HDL; said decision block LV supported Verilog primitives software module comprised of a software module searching said string for Verilog primitives supported natively by LogicVision (LV).

9. The invention of claim 8, wherein:
a LV supported Verilog primitives and setup data structure software module for setting up a data structure for containing information relating to said components, and for adding to said data structure any LV supported Verilog primitives found in said string.

10. The invention of claim 9, wherein:
said data structure is a hash structure.

11. A computer software system for translating HDL, comprising: a reading software module for reading a HDL description that describes a circuit; a translating software module which is configured such that said translating software module translates said HDL description from said reading software module into components comprising logic gates, obviating the need to translate said HDL description into OTDD graphs, wherein said HDL description is a Verilog HDL description and comprises Verilog User Defined Primitives (UDP); a decision block LV unsupported Verilog primitives software module for processing the Verilog HDL description from said reading software module; said reading software module comprised of a software module reading in a string representing said Verilog HDL; said decision block LV unsupported Verilog primitives software module comprised of a software module searching said string for Verilog primitives unsupported natively by LogicVision (LV).

12. The invention of claim 11, wherein:
a LV unsupported Verilog primitives and setup data structure software module for setting up a data structure for containing information relating to said components, and for adding to said data structure any LV unsupported Verilog primitives found in said string, said LV unsupported Verilog primitives translated into and changed to LV supported primitives by said LV unsupported Verilog primitives and setup data structure software module.

13. A computer software system for translating HDL, comprising: a reading software module for reading a HDL description that describes a circuit; a translating software module, which is configured such that said translating software module translates said HDL description from said reading software module into components comprising logic gates, obviating the need to translate said HDL description into OTDD graphs wherein said HDL description is a Verilog HDL description and comprises Verilog User Defined Primitives (UDP); a decision block LSI Flexstream supported UDP software module for processing the Verilog HDL description from said reading software module; said reading software module comprised of a software module reading in a string representing said Verilog HDL; said decision block LSI Flexstream supported UDP software module comprised of a software module searching said string for User Defined Primitives (UDPS) supported by LSI Flexstream.

14. The invention of claim 13, further comprising: a Flexstream UDP port checking and setup data structure software module for setting up a data structure for containing information relating to said components, and for adding to said data structure any Flexstream supported UDPs found in said string, said Flexstream UDP port checking and setup data structure software module checking the ports of said Flexstream supported UDPs.

15. The invention of claim 14, wherein:
said data structure is a hash structure.

16. A computer software system for translating HDL, comprising: a reading software module for reading a HDL description that describes a circuit; a translating software module which is configured such that said translating software module translates said HDL description from said reading software module into components comprising logic gates, obviating the need to translate said HDL description into OTDD graphs, wherein said HDL description is a Verilog HDL description and comprises Verilog User Defined Primitives (UDP); a decision block LSI Flexstream supported individual UDP name recognition software module for processing the Verilog HDL description from said reading software module; said reading software module comprised of a software module reading in a string representing said Verilog HDL; said decision block LSI Flexstream supported individual UDP name recognition software module comprised of a software module searching said string for UDP names recognized in LSI Flex stream.

17. The invention of claim 16, wherein:
a LSI Flexstream supported individual UDP name recognition gate level equivalent translation and setup data structure software module for setting up a data structure for containing information relating to said components, and for adding to said data structure any individual UDP names recognized in LSI Flexstream;
said LSI Flexstream supported individual UDP name recognition gate level equivalent translation and setup data structure software module translating any of said individual UDP names into gate level equivalents, and storing said gate level equivalents in said data structure.

18. The invention of claim 17, wherein:
said data structure is a hash structure.

19. A computer software system for translating HDL, comprising: a reading software module for reading a HDL description that describes a circuit; a translating software module which is configured such that said translating software module translates said HDL description from said reading software module into components comprising logic gates, obviating the need to translate said HDL description into OTDD graphs, wherein said HDL description is a Verilog HDL description and comprises Verilog User Defined Primitives (UDP); a decision block LSI Flexstream test tool unsupported UDP software module for processing the Verilog HDL description from said reading software module; said reading software module comprised of a software module reading in a string representing said Verilog HDL; said decision block LSI Flexstream test tool unsupported UDP software module comprised of a software module searching said string for UDPs unsupported in LSI Flexstream and used for test tool modeling purposes.

20. A computer software system for translating HDL, comprising: a reading software module for reading a HDL description that describes a circuit; a translating software module which is configured such that said translating software module translates said HDL description from said reading software module into components comprising logic gates, obviating the need to translate said HDL description into OTDD graphs, wherein said HDL description is a Verilog HDL description and comprises Verilog User Defined Primitives (UDP); an unknown statement software module for processing the Verilog HDL description from said reading software module; said reading software module comprised of a software module reading in a string representing said Verilog HDL; said unknown statement software module comprised of a software module that outputs an error message when control is passed to said unknown statement software module.

21. A computer software system for translating HDL, comprising: a reading software module for reading a HDL description that describes a circuit; a translating software module which is configured such that said translating software module translates said HDL description from said reading software module into components comprising logic gates, obviating the need to translate said HDL description into OTDD graphs; and an output software module for outputting said components from said translating software module in a useable format, wherein said output software module comprising a remove unconnected gates software module for removing extra logic gates not connected; and said output software module further comprising a print LV model software module for outputting said components in a LogicVision format.

22. A computer software system for translating HDL, comprising: a reading software module for reading a HDL description that describes a circuit; a translating software module which is configured such that said translating software module translates said HDL description from said reading software module into components comprising logic gates, obviating the need to translate said HDL description into OTDD graphs, wherein said HDL description is a Verilog HDL description and comprises Verilog User Defined Primitives (UDP); said reading software module comprised of a software module reading in a string representing said Verilog HDL; and further comprising, a strip-out software module for removing behavioral code, comments, and compiler directives from said string representing Verilog HDL.

23. An apparatus for converting HDL into another format, comprising: a processor, I/O, controlled by said processor, for inputting and outputting data, and memory operatively connected and cooperating with said processor; software modules stored in said memory, forming a software program executed by said processor, said modules comprising, a reading software module for reading a HDL description; a translating software module configured such that said translating software module translates said HDL description obtained from said reading software module into components comprising logic gates and obviating the need for translating said HDL description to OTDD graphs; and, an output software module for outputting said components from said translating software module in a useable format; wherein said translating software module comprises a loop comprising a plurality of decision block software modules and a plurality of setup data structure software modules; said reading software module comprises a software module reading in a string representing said HDL description; said plurality of decision block software modules of said translating software module searching said string read by said reading software module; said decision block software modules passing control to said setup data structure software modules upon searching said string and said decision block software modules satisfying a predetermined condition.

24. The apparatus according to claim 23, wherein:
said HDL description is a Verilog HDL description and comprises Verilog User Defined Primitives (UDP), and said components output by said output software module comprise gate level primitives;
said decision block software modules comprise a Verilog module declaration software module for processing the Verilog description string from said reading software module, said Verilog module declaration software module searching said string for a portion of said string containing the Verilog keyword 'module' and for the corresponding port list to said 'module';
said setup data structure software modules comprise an initializing, check port and setup data structure software module for initializing variables relating to said portion of said string found in said decision block Verilog module declaration software module, for checking said corresponding port list for correct syntax, and for setting up a data structure for containing information relating to said components;
said Verilog module declaration software module passing control to said initializing, check port and setup data structure software module upon finding the Verilog keywords 'module' and the corresponding port list to said 'module' in said portion of said string.

25. The apparatus according to claim 23, wherein:
said decision block software modules comprise a port declaration software module for processing the HDL description string from said reading software module, said port declaration software module searching said string for port declarations;
said setup data structure software modules comprise a port information and setup data structure software module for setting up a data structure for containing information relating to said components, and for adding to said data structure input/output/inout port information;
said port declaration software module passing control to said port information and setup data structure software module upon the occurrence of a port declaration in said string.

26. The apparatus according to claim 23, wherein:
said HDL description is a Verilog HDL description and comprises Verilog User Defined Primitives (UDP), and said components output by said output software module comprise gate level primitives;
said decision block software modules comprise a Verilog primitive decision block software module for searching said string for the presence or absence of Verilog primitives;
said setup data structure software modules comprise a LV supported Verilog primitive setup data structure software module and a LV unsupported Verilog primitive setup data structure software module;
said Verilog primitive decision block software module passing control to said setup data structure software modules upon the occurrence of a Verilog primitive in said string;
wherein said LV supported Verilog primitive setup data structure software module sets up a data structure for containing information relating to said components, and adds to said data structure any Verilog primitives supported by the LogicVision model natively, and;
wherein said LV unsupported Verilog primitive setup data structure software module sets up a data structure for containing information relating to said components, and translates said LV unsupported Verilog primitives found in said string to LV supported primitives.

27. The apparatus according to claim 23, wherein:
said HDL description is a Verilog HDL description and comprises Verilog User Defined Primitives (UDP), and said components output by said output software module comprise gate level primitives;
said decision block software modules comprise a LSI Flexstream UDP decision block software module for searching said string for the presence or absence of UDPs supported by LSI Flexstream;
said setup data structure software modules comprise a LSI Flexstream UDP setup data structure software module;
said LSI Flexstream UDP decision block software module passing control to said LSI Flexstream UDP setup data structure software module upon the occurrence of a predetermined condition in said string involving UDP concerning a LSI Flexstream UDP format;
wherein said LSI Flexstream UDP setup data structure software module sets up a data structure for containing information relating to said components, and adds to said data structure any LSI Flexstream format UDPs.

28. The apparatus according to claim 23, wherein:
said decision block software modules comprise a default software module for outputting an error message.

29. An apparatus for converting HDL into another format, comprising: a processor, I/O, controlled by said processor, for inputting and outputting data, and memory operatively connected and cooperating with said processor, software modules stored in said memory, forming a software program executed by said processor, said modules comprising, a reading, software module for reading a HDL description; a translating software module configured such that said translating software module translates said HDL description obtained from said reading software module into components comprising logic gates and obviates the need for translating said HDL description to OTDD graphs; and, an output software module for outputting said components from said translating software module in a useable format, wherein said HDL description is a Verilog HDL description and comprises Verilog User Defined Primitives (UDP), and said components output by said output software module comprise gate level primitives, wherein said translating software module setting up a data structure for containing information relating to said components; said output software module receiving data information from said data structure for outputting said components in a useable format, wherein said HDL description is a Verilog HDL description and comprises Verilog User Defined Primitives (UDP), and said components output by said output software module comprise gate level primitives; said output software module outputs said components in the LogicVision model format.

30. An apparatus for converting HDL into another format, comprising: a processor, I/O, controlled by said processor, for inputting and outputting data, and memory operatively connected and cooperating with said processor; software modules stored in said memory forming a software program executed by said processor, said modules comprising, a reading software module for reading a HDL description; a translating software module configured such that said translating software module translates said HDL description obtained from said reading software module into components comprising logic gates and obviates the need for translating said HDL description to OTDD graphs; and, an output software module for outputting said components from said translating software module in a useable format, wherein said HDL description is a Verilog HDL description and comprises Verilog User Defined Primitives (UDP), and said components output by said output software module comprise gate level primitives, wherein said reading software module comprises a software module reading in a string representing said HDL description; and further comprising, a strip-out software module for determining the presence of behavioral codes, comments and compiler directives in said string, and for stripping out said behavioral codes, comments and compiler directives from said string.

31. A method for translating HDL into primitive logic gates comprising the steps of reading a HDL description with reading software, said reading software module reading a string representing said HDL description; translating said HDL description obtained from said reading software module with a translating software module into components comprising logic gates and obviating the need for translating said HDL description to OTDD graphs; outputting said components in a useable format with an output software module; setting up a data structure to store said components; and storing said components in said data structure, wherein said HDL description is a Verilog HDL description and comprises Verilog User Defined Primitives (UDP) and further comprising the steps of: determining the presence of LogicVision supported Verilog primitives in said string; storing information relating to said LogicVision supported Verilog primitives in said data structure.

32. The method according to claim 31, further comprising the steps of:

determining the presence of LogicVision unsupported Verilog primitives in said string;

translating any LogicVision unsupported Verilog primitives into LogicVision supported primitives;

storing information relating to said LogicVision supported Verilog primitives in said data structure.

33. A method for translating HDL into primitive logic gates comprising the steps of reading a HDL description with reading software, said reading software module reading a string representing said HDL description; translating said HDL description obtained from said reading software module with a translating software module into components comprising logic gates and obviating the need for translating said HDL description to OTDD graphs; outputting said components in a useable format with an output software module; setting up a data structure to store said components; and storing said components in said data structure, wherein said HDL description is a Verilog HDL description and comprises Verilog User Defined Primitives (UDP) and further comprising the steps of: determining the presence of LSI Flexstream supported UDPs in said string; storing information relating to said LSI Flexstream supported UDPs in said data structure.

34. The method according to claim 33, further comprising the steps of:

determining the presence of LSI Flexstream unsupported UDPs in said string;

checking the syntax of said LSI Flexstream supported UDPs, correcting for any incorrect syntax and storing information relating to said LSI Flexstream supported UDPs in said data structure.

35. A method for translating HDL into primitive logic gates comprising the steps of reading a HDL description with reading software, said reading software module reading a string representing said HDL description; translating said HDL description obtained from said reading software module with a translating software module into components comprising logic gates and obviating the need for translating said HDL description to OTDD graphs; outputting said components in a useable format with an output software module; determining the presence of behavioral codes, comments and compiler directives in said string; and stripping out said behavioral codes, comments and compiler directives from said string.

36. A method for translating HDL into primitive logic gates comprising the steps of reading a HDL description with reading software, said reading software module reading a string representing said HDL description; translating said HDL description obtained from said reading software module with a translating software module into components comprising logic gates and obviating the need for translating said HDL description to OTDD graphs; outputting said components in a useable format with an output software module; wherein said HDL description is a Verilog HDL description and comprises Verilog User Defined Primitives (UDP) and further comprising the step of outputting said components in a useable format comprising the LogicVision model format.

* * * * *